(12) United States Patent
Piquette et al.

(10) Patent No.: US 10,590,339 B2
(45) Date of Patent: Mar. 17, 2020

(54) METHOD FOR PRODUCING A CONVERTER ELEMENT, CONVERTER ELEMENT AND LIGHT EMITTING DEVICE

(71) Applicant: OSRAM Opto Semiconductors GmbH, Regensburg (DE)

(72) Inventors: Alan Piquette, Peabody, MA (US); Maxim N. Tchoul, Winchester, MA (US); Gertrud Kräuter, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/981,707

(22) Filed: May 16, 2018

(65) Prior Publication Data

US 2019/0352561 A1    Nov. 21, 2019

(51) Int. Cl.

| | | |
|---|---|---|
| C09K 11/02 | (2006.01) | |
| H01L 33/50 | (2010.01) | |
| H01L 33/56 | (2010.01) | |
| C08G 77/18 | (2006.01) | |
| C08G 77/06 | (2006.01) | |
| C08K 3/36 | (2006.01) | |
| B32B 27/28 | (2006.01) | |
| B32B 38/00 | (2006.01) | |

(Continued)

(52) U.S. Cl.
CPC .............. *C09K 11/02* (2013.01); *B32B 27/08* (2013.01); *B32B 27/283* (2013.01); *B32B 38/00* (2013.01); *C08G 77/06* (2013.01); *C08G 77/18* (2013.01); *C08K 3/36* (2013.01); *H01L 33/502* (2013.01); *H01L 33/56* (2013.01); *B32B 2038/0076* (2013.01); *B32B 2383/00* (2013.01); *B32B 2457/20* (2013.01); *C08G 77/70* (2013.01); *H01L 2933/0041* (2013.01)

(58) Field of Classification Search
CPC ....... C09K 11/02; B32B 27/08; B32B 27/283; B32B 2038/0076; B32B 2383/00; H01L 33/502; H01L 2933/0041
See application file for complete search history.

(56) References Cited

U.S. PATENT DOCUMENTS

2010/0113252 A1\* 5/2010 Bordia .................. C08J 3/24
501/154
2013/0125365 A1    5/2013 Goto et al.
(Continued)

FOREIGN PATENT DOCUMENTS

| JP | 6060703 B2 | 1/2017 |
|---|---|---|
| WO | 2017182390 A1 | 10/2017 |
| WO | 2018002334 A1 | 1/2018 |

*Primary Examiner* — Julia Slutsker
(74) *Attorney, Agent, or Firm* — Slater Matsil, LLP (57) ABSTRACT

A method for producing a converter element, a converter element and a light emitting device are disclosed. In an embodiment a method for producing a converter element providing at least one phosphor and a liquid polysiloxane resin and preparing a cured polysiloxane powder from a first fraction of the liquid polysiloxane resin. The method further includes preparing a mixture including the at least one phosphor, the cured polysiloxane powder and a second fraction of the liquid polysiloxane resin, casting and curing the mixture to a cured layer and singulating the cured layer.

12 Claims, 4 Drawing Sheets

(51) Int. Cl.
*B32B 27/08* (2006.01)
*C08G 77/00* (2006.01)

(56) References Cited

U.S. PATENT DOCUMENTS

| | | |
|---|---|---|
| 2014/0001949 A1* | 1/2014 | Kimura .................. H05B 33/10 |
| | | 313/498 |
| 2018/0340119 A1 | 11/2018 | Piquette et al. |
| 2019/0099963 A1* | 4/2019 | Donkervoort ....... B29C 44/3415 |
| 2019/0123248 A1 | 4/2019 | Kräuter et al. |
| 2019/0259919 A1 | 8/2019 | Piquette et al. |
| 2019/0322837 A1 | 10/2019 | Tchoul et al. |

* cited by examiner

METHOD FOR PRODUCING A CONVERTER ELEMENT, CONVERTER ELEMENT AND LIGHT EMITTING DEVICE

TECHNICAL FIELD

The invention refers to a method for producing a converter element, a converter element and a light emitting device.

BACKGROUND

Converter elements, like wavelength converting layers, are used for converting electromagnetic radiation emitted by light-emitting diodes. When producing a converter element, commonly a matrix material is mixed with phosphors and processed into thin sheets. For example, a polysiloxane matrix reacts with atmospheric moisture, resulting in transformation of the liquid resin into a solid material, also known as moisture curing. During this process, the resin loses up to 30% of its mass due to evaporation of the volatile products of the curing reaction. This leads to the corresponding shrinkage in volume resulting in internal strains within the material and often leading to the formation of cracks as well as warpage of the sheet. Multiple cracks may render the material unusable for its application in converter elements.

Up to now methods for avoiding cracks and warpage are to limit the thickness of the converter layer or to increase the amount of inorganic filler like amorphous silica to reduce the relative amount of the shrinking component. However, thicker converter layers are needed for many applications and too high amounts of fillers may negatively influence the characteristics of the converter layers.

SUMMARY

Embodiments of the invention provide a method for producing polysiloxane-based wavelength converter elements and converter elements with improved properties. Further embodiments provide a converter element of high quality and a light emitting device including such a converter element.

According to one aspect a method is provided for producing a converter element, the method comprising the step of: providing at least one phosphor and a liquid polysiloxane resin.

A converter element is to be understood as an element that absorbs electromagnetic radiation within a certain first range of wavelengths and then emits radiation having a second range of wavelengths. These wavelength ranges can be distinct from each other or there could be a significant overlap between the absorbed and the emitted wavelengths. The absorption and the emission of wavelengths is performed by the phosphor incorporated in the converter element.

Thus, a single phosphor may be used for the method as well as a blend of different phosphors. For example, if a warm white colorpoint and a CRI of at least 90 have to be achieved when a converter element is used in a light emitting device, a phosphor blend may be used. As a green phosphor $Lu_3Al_5O_{12}:Ce^{3+}$ and as a red phosphor $(Sr,Ca)AlSiN_3:Eu^{2+}$ may be used as a phosphor blend. Depending on the desired colorpoint to be achieved, many other phosphors or blends of phosphors may be used as well.

The following is a nonexclusive list of phosphors that may be used for the method: $(RE_{1-x}Ce_x)_3(Al_{1-y}A'_y)_5O_{12}$ where RE is at least one of Y, Lu, Tb, and Gd, x is in a range $0<x\leq0.1$, A' is at least one of Sc and Ga, and y is in a range $0\leq y\leq1$; $(RE_{1-x}Ce_x)_3(Al_{5-2y}Mg_ySi_y)O_{12}$ where RE is at least one of Y, Lu, Tb, and Gd, x is in a range $0<x\leq0.1$, and y is in a range $0\leq y\leq2$; $(RE_{1-x}Ce_x)_3Al_{5-y}Si_yO_{12-y}N_y$ where RE is at least one of Y, Lu, Tb, and Gd, x is in a range $0<x\leq0.1$, and y is in a range $0\leq y\leq0.5$; $(RE_{1-x}Ce_x)_2CaMg_2Si_3O_{12}:Ce^{3+}$ where RE is at least one of Y, Lu, Tb, and Gd, and x is in a range $0<x\leq0.1$; $(AE_{1-x}Eu_x)_2Si_5N_8$ where AE is at least one of Ca, Sr, and Ba, and x is in a range $0<x\leq0.1$; $(AE_{1-x}Eu_x)AlSiN_3$ where AE is at least one of Ca, Sr, and Ba, and x is in a range $0<x\leq0.1$; $(AE_{1-x}Eu_x)_2Al_2Si_2N_6$ where AE is at least one of Ca and Sr, and x is in a range $0<x\leq0.1$; $(Sr_{1-x}Eu_x)LiAl_3N_4$ where x is in a range $0<x\leq0.1$; $(AE_{1-x}Eu_x)_3Ga_3N_5$ where AE is at least one of Ca, Sr, and Ba, and x is in a range $0<x\leq0.1$; $(AE_{1-x}Eu_x)Si_2O_2N_2$ where AE is at least one of Ca, Sr, and Ba, and x is in a range $0<x\leq0.1$; $(AE_xEu_y)Si_{12-2x-3y}Al_{2x+3y}O_yN_{16-y}$ where AE is at least one of Ca, Sr, and Ba, x is in a range $0.2\leq z\leq2.2$, and y is in a range $0<y\leq0.1$; $(AE_{1-x}Eu_x)_2SiO_4$ where AE is at least one of Ca, Sr, and Ba, and x is in a range $0<x\leq0.1$; and $(AE_{1-x}Eu_x)_3SiO_5$ where AE is at least one of Ca, Sr, and Ba, and x is in a range $0<x\leq0.1$.

Other phosphors may also be used including slight modifications of the examples listed above, e.g., incorporation of fluoride or other halide ions.

The liquid polysiloxane resin may be a partially cured polysiloxane resin. After finishing the curing the polysiloxane resin is a solid material. Thus, the liquid polysiloxane resin serves as a precursor material comprising monomeric, oligomeric and polymeric compounds. The cured polysiloxane resin comprises polymeric compounds.

Generally, a polysiloxane may be categorized by its functional monomeric unit that makes up the polymer There are four types of monomeric units found in polysiloxane materials as shown in Table 1 together with their typical abbreviation:

TABLE 1

| Monomeric unit | Abbreviation |
|---|---|
| ~~O—Si(R)(R)—R | M |
| ~~O—Si(R)(R)—O~~ | D |
| ~~O—Si(R)(O~~)—O~~ | T |
| ~~O—Si(O~~)(O~~)—O~~ | Q |

The monomeric units are differentiated from each other by the relative number of oxygen and carbon atoms bonded to the silicon atom. If there are no oxygen atoms bonded to the silicon atom, the material is called a silane. However, there can be one to four oxygen atoms bonded to a silicon atom in a siloxane. The possibilities for the bonding where R is used to denote a generic organic group that is bonded to the silicon through a carbon are shown in Table 1. For example, a polysiloxane based mostly on D-units may be used in compositions as an adhesive or as an encapsulant.

The polysiloxane resin that may be used for the disclosed method of producing a converter element may be based on primarily T-unit polysiloxanes, which means that they have much less organic content than the corresponding D-unit polysiloxanes. The low organic content leads to better thermal stability. Reducing the volume shrinkage in a T-unit based polysiloxane enables its use in converter elements and, thus, in LEDs.

According to another embodiment the method comprises the further step of preparing a cured polysiloxane powder from a first fraction of the liquid polysiloxane resin. The first fraction of the polysiloxane resin is meant to be the amount of the polysiloxane resin which is used to prepare the desired amount of cured polysiloxane powder. The cured polysiloxane powder comprises cured and milled polysiloxane resin. Such a powder can be used as an inert filler in a liquid polysiloxane resin. Addition of the cured polysiloxane powder to a liquid polysiloxane resin reduces the effective amount of the liquid polysiloxane resin in the mixture, thus reducing the percentage of shrinkage when curing the mixture. For example, a 100% liquid methyl methoxy polysiloxane resin, based on primarily T-units, has a 30% volume reduction upon curing, while a mixture containing 35 vol % phosphor, 35 vol % of the cured polysiloxane powder, and 30 vol % of liquid methyl methoxy polysiloxane resin will experience only 10% volume reduction, since only the liquid polysiloxane resin changes its volume, while the other components do not. In contrast to other fillers like, for example, fumed silica, the addition of a cured polysiloxane powder does not strongly affect the mixture's viscosity.

The cured polysiloxane powder has typically a particle size ranging from 5 µm to 100 µm in size, such that the cured polysiloxane powder has very little effect on rheology of the mixture of cured polysiloxane powder and liquid polysiloxane resin. Further, in contrast to, for example, micron size silica filler, cured polysiloxane powder does not produce light scattering when applied in a converter element, because, being the same material as the polysiloxane resin, it does not create a second phase with a different refractive index.

According to another embodiment, the method for producing a converter element further comprises the step of preparing a mixture including the at least one phosphor, the cured polysiloxane powder and a second fraction of the liquid polysiloxane resin. The second fraction of the polysiloxane resin is the polysiloxane resin not being used for preparing the cured polysiloxane powder. When preparing the mixture, the relative ratios of the components can vary depending on the required viscosity and optical properties that the material of the converter element should have. The mixture may have the form of a slurry.

According to another embodiment the method for producing a converter element comprises the steps of casting and curing the mixture to a cured layer, and singulating the cured layer. Thus, the liquid polysiloxane resin is cured together with the cured polysiloxane powder and a converter element is produced. The converter element comprises the cured polysiloxane resin as a matrix material, wherein the phosphor and the cured polysiloxane powder are embedded.

The converter element produced with the method may comprise a thickness being chosen from a range of 10 µm to 200 µm. Due to the method for producing the converter element, the converter element enables a high thickness of, for example, more than 115 µm without showing cracks or warping of its material. Such a high thickness may be needed when used to assemble certain LED packages.

According to one aspect a method is provided for producing a converter element, the method comprising the steps of: providing at least one phosphor and a liquid polysiloxane resin, preparing a cured polysiloxane powder from a first fraction of the liquid polysiloxane resin, preparing a mixture including the at least one phosphor, the cured polysiloxane powder and a second fraction of the liquid polysiloxane resin, casting and curing the mixture to a cured layer, and singulating the cured layer.

According to another embodiment the liquid polysiloxane resin comprises the formula:

wherein $T^1$ and $T^2$ represent terminal groups, $R^1$ to $R^4$ each represent side groups, $0.8 \leq n \leq 1$, $0 \leq m < 0.2$ and $n+m=1$. The R- and T-groups can all be the same, for example, a methyl group. In other embodiments each functional group can be a different group. In another embodiment some of the groups can be the same and some can be different. In some cases one of the groups can be made up of more than one functional group.

According to one embodiment the terminal groups $T^1$ and $T^2$ comprise a chemical reactive group chosen from a group containing alkoxy, vinyl, hydroxyl, carboxylic acid, ester, any other of the reactive functional groups know from the organic chemistry field, and combinations thereof.

According to another embodiment the terminal groups $T^1$ and $T^2$ are chosen from less reactive compounds chosen from a group containing hydrogen, methyl, ethyl or any alkyl, aryl groups, and combinations thereof.

According to another embodiment $R^1$ to $R^4$ are chosen—independently from each other—from a group containing methyl, methoxy, ethyl, ethoxy, phenyl, phenoxy, vinyl, and trifluoropropyl. In particular $R^1$ to $R^4$ are chosen—independently from each other—from methyl and methoxy.

According to another embodiment the liquid polysiloxane resin comprises a methoxy methyl polysiloxane. An exemplary, idealized structure of the repeat unit of such a methoxymethyl polysiloxane is shown by formula 1:

Formula 1

The methoxy content may be in the order of 10 to 50 wt %, preferably in the range of 15 to 45 wt %, even more preferably in the range of 30 to 40 wt %, for example, 32 wt %. The number of repeat units n as shown in formula 1 can vary. The molecular weight, and thus the number of repeat units n, may be such that the viscosity of the polysiloxane is in the range of 1 to 150 mPas, preferably in the range of 2 to 40 mPas. To be used in this method, the polysiloxane resin should contain no more than 5 wt % solvent, the solvent being, for example, toluene or xylene.

According to another embodiment, preparing a cured polysiloxane powder includes curing the first fraction of the liquid polysiloxane resin at ambient conditions, heating and milling the cured polysiloxane resin. The curing at ambient conditions takes place, for example, for at least 12 to 24 hours. The heating takes place, for example, at a temperature in a range of 150° C. to 275° C. The milling may be performed using a blade mixer to granulate the cured polysiloxane resin into small particles. This method leads to good results even in the case that the cured polysiloxane resin is soft and/or pliable after curing.

According to another embodiment fumed silica is added to the first fraction of the liquid polysiloxane resin before curing. Fumed silica may thicken the polysiloxane resin for further processing. The specific surface area of the fumed silica may be in the range 100 m2/g to 300 m2/g. Hydrophobic and hydrophilic fumed silica powders may be used, preferably hydrophobic fumed silica.

According to another embodiment, fumed silica is added to the second fraction of the liquid polysiloxane resin before preparing the mixture. Particularly, the same fumed silica may be added to the first fraction of polysiloxane resin and to the second fraction of polysiloxane resin. Additionally, the amount of fumed silica relative to the polysiloxane resin in the first fraction of polysiloxane resin and in the second fraction of polysiloxane resin may be the same.

According to another embodiment preparing the mixture comprises mixing the cured polysiloxane powder, the at least one phosphor and the second fraction of the liquid polysiloxane resin. The method according to this embodiment may be called "single layer method". Such a mixture may be processed into a layer using, for example, a doctor blade technique, followed by curing to produce a solid material. The method according to this embodiment is a single batch process producing the converter element with uniform composition and being identical on both, top and bottom sides.

According to another embodiment, a hardener is added to the mixture. The choice of a hardener depends on the polysiloxane resin being used. The hardener may be chosen from titanium alkoxide, for example, titanium n-butoxide, or titanium ethyl aceto acetate. Titanium n-butoxide is preferably used when using a methyl methoxy polysiloxane resin.

According to another embodiment, preparing the mixture comprises preparing a first mixture by mixing the at least one phosphor and a portion of the second fraction of the liquid polysiloxane resin and preparing a second mixture by mixing the cured polysiloxane powder and another portion of the second fraction of the liquid polysiloxane resin. The method according to this embodiment may be called double-layer method. With this method a two-layer material may be produced, wherein the bottom layer comprises a phosphor-filled polysiloxane resin and the top layer comprises the same polysiloxane resin filled with the cured polysiloxane powder. The first and the second mixtures may have the texture of a slurry.

The two mixtures are deposited one above the other by using, for example, a doctor-blading process. First, the first mixture is deposited for producing a phosphor-filled first layer, and within several seconds the second mixture is deposited for producing a phosphor-free second layer. The two layers may undergo curing simultaneously. The amount of the cured polysiloxane powder in the phosphor-free second layer may be selected so that the volume shrinkage during the curing matches that of the phosphor-containing first layer. This allows cracks and warpage to be avoided during curing. The method according to this embodiment provides a converter element wherein the concentration of the at least one phosphor is very high in one part of the converter element, wherein this part may be attached to a LED, resulting in an improved thermal transfer from the phosphor particles to the LED, and thus, avoiding overheating of the converter element.

Depending on the application of the converter element the single-layer method or the double-layer method may be chosen when producing the converter element. For very high power LED devices, where thermal management is of high importance, the double-layer method is preferable.

According to another embodiment, a hardener is added to the first mixture and to the second mixture. As a hardener titanium alkoxide, for example, titanium n-butoxide, or titanium ethyl aceto acetate may be chosen.

According to another embodiment the first mixture is cast to a first layer and the second mixture is cast to a second layer being arranged on the first layer, the first layer having a thickness being equal to or less than a thickness of the second layer. Thus, the phosphor-free second layer may be thicker than the phosphor-containing first layer.

According to another embodiment the first mixture and the second mixture are cured together. Thus, the first layer comprising the first mixture and the second layer comprising the second mixture are cured together.

According to another aspect, a converter element is provided. The converter element comprises a cured layer comprising at least one phosphor and a cured polysiloxane powder, the phosphor and the cured polysiloxane powder being embedded in a matrix material comprising a cured polysiloxane resin.

All features and characteristics disclosed with respect to the method are also valid for the converter element and vice versa. For example, features disclosed with respect to the at least one phosphor, the cured polysiloxane powder and the polysiloxane resin are also valid for the at least one phosphor, the cured polysiloxane powder and the polysiloxane resin of the converter element. Further compounds added during the method for producing a converter element, like a hardener or fumed silica, may also be present in the converter element.

According to one embodiment the converter element is produced with a method, the method comprising the steps of: providing at least one phosphor and a liquid polysiloxane resin, preparing a cured polysiloxane powder from a first fraction of the liquid polysiloxane resin, preparing a mixture including the at least one phosphor, the cured polysiloxane powder and a second fraction of the liquid polysiloxane resin, casting and curing the mixture to a cured layer, and singulating the cured layer.

In other words, the converter element may be produced with a method as disclosed above.

According to an embodiment the converter element has a total thickness of equal to or more than 10 μm. Particularly, the thickness may be chosen from a range of 10 to 200 μm. According to another embodiment the converter element has a total thickness of equal to or more than 115 μm. Despite the high thickness the converter element does not show cracks or warping of its material.

According to another embodiment the cured layer comprises at least a first layer and a second layer, wherein the second layer is free of the at least one phosphor. The converter element may comprise additional layers, especially additional phosphor-free layers. Thus, a multilayer converter element may be provided comprising two or more layers.

According to another embodiment the second layer has a thickness being equal to or greater than the thickness of the first layer. Thus, the thicker second layer of the converter element may be a clear, non-fluorescent layer. A converter element comprising at least two layers enables a good thermal management as the luminescent material, i.e., the at least one phosphor, is located as close to the LED chip as possible since the main heat removal path is down through the chip into the underlying board. For example, a total thickness of the converter element of 115 μm or more may include a first layer comprising the phosphor, having a thickness of 60 μm or less. In other words, the phosphors are located within the first 60 μm or less from the LED surface, when the converter element is applied thereon with the first layer facing the LED. According to another embodiment the first layer comprises a thickness of 60 μm.

As mentioned above, for a typical methoxy methyl polysiloxane based on T-units, there is a volume shrinkage of about 30% as a result of a curing. In a converter element comprising at least two layers, the phosphor in the first layer comprises, for example, up to 60% of the volume. The phosphor particles do not shrink, so unless that shrinkage is compensated for in the second layer, the two layers will have different shrink factors and the material will warp and crack. The second phosphor-free layer shrinks more than the phosphor containing first layer and the element curls towards the second layer, ripping the material apart. These disadvantages may be reduced and preferably avoided by preparing a converter element with a method as described above, i.e., introducing a cured polysiloxane powder as a filler in the polysiloxane resin of the second layer. In other words, the converter element comprises a high quality crack-free material enabling its use in an LED.

According to another aspect, a light emitting device is provided including an active electromagnetic radiation emitting layer sequence and a converter element according to the above-mentioned features being arranged on the active electromagnetic radiation emitting layer sequence.

All features and characteristics of the converter element are also valid for the light emitting device and vice versa.

According to an embodiment the light emitting device comprises a light emitting diode (LED).

BRIEF DESCRIPTION OF THE DRAWINGS

Additional advantages, advantageous embodiments and developments are explained in the following in connection with the figures and examples.

In the examples and figures, like parts are designated by like numerals. The depicted parts and their proportions are not to scale, rather some parts as, for example, layers may be depicted exaggerated large in order to improve the presentability.

DETAILED DESCRIPTION OF ILLUSTRATIVE EMBODIMENTS

Figure 1:
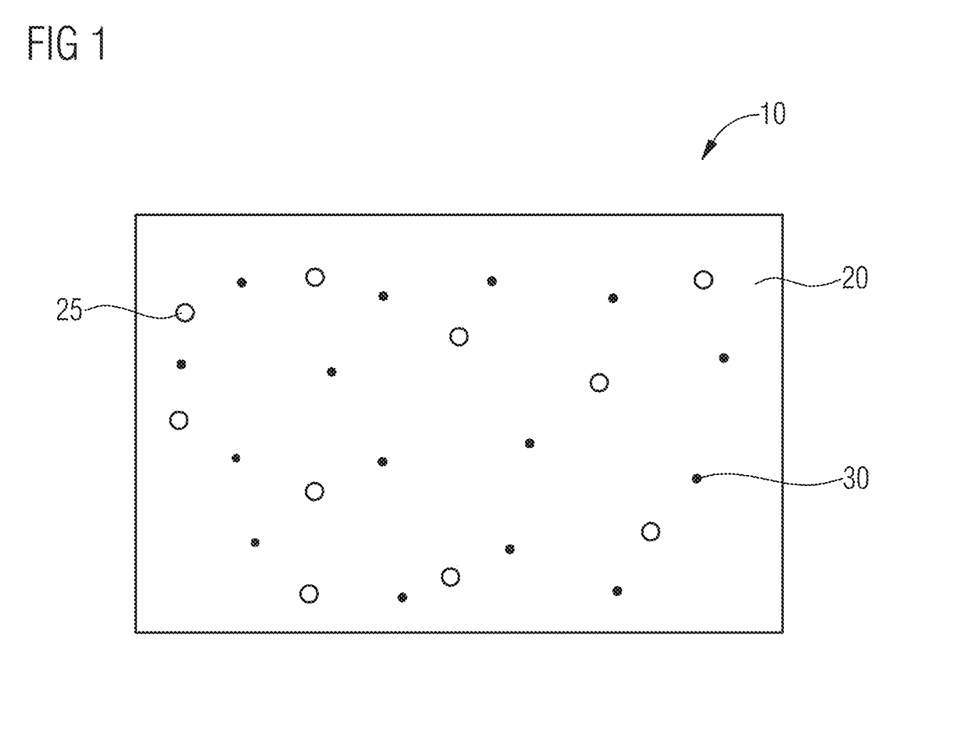
FIGS. 1 and 2 show schematic cross sections of converter elements according to exemplary embodiments.

FIG. 1 shows a converter element 10 comprising a polysiloxane resin 20 as a matrix material and phosphors 30 embedded therein. The polysiloxane resin 20 is made from a liquid partially cured polysiloxane resin. Further, a cured polysiloxane powder 25 which is made from the same liquid polysiloxane resin is embedded in the polysiloxane resin 20. Optionally, fumed silica and a hardener are added to the liquid polysiloxane resin and the cured polysiloxane powder 25 when producing the converter element 10. The converter element 10 shown in FIG. 1 is made with a single-layer method wherein the milled cured polysiloxane powder 25 is added as an additional filler to the system containing partially cured liquid polysiloxane resin, a single phosphor or a blend of several phosphors and, if necessary, fumed silica, and a hardener, for example, titanium n-butoxide.

Figure 2:
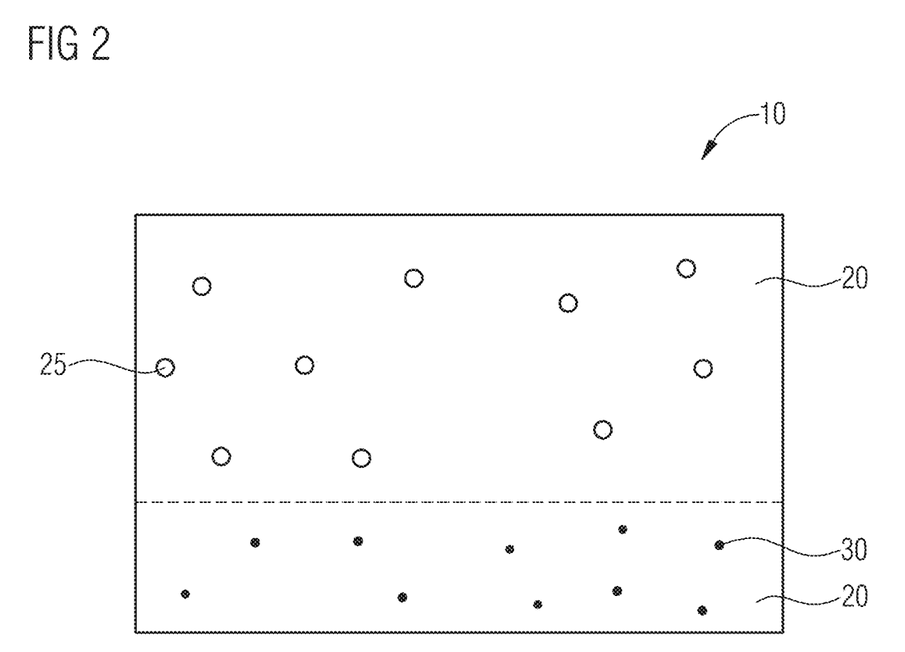

FIG. 2 shows another embodiment of a converter element 10, having two layers, wherein the first layer contains the polysiloxane resin 20 with at least one phosphor 30 embedded therein and optionally comprising a fumed silica, whereas the second layer contains a polysiloxane resin 20, wherein a cured polysiloxane powder 25 is embedded therein. Also the polysiloxane resin 20 of the second layer optionally comprises a fumed silica.

Such a converter element 10 is produced with a double-layer method where a two-layer material is produced. The two layers are consequently deposited using a doctor blading process. The phosphor-filled first layer is deposited first, and within several seconds the clear, second layer is deposited on the first layer. The two layers undergo curing simultaneously. The amount of the cured polysiloxane powder 25 in the polysiloxane resin 20 of the second layer is selected so that the volume shrinkage during the curing matches that of the first layer in which the phosphor 30 is embedded in the polysiloxane resin 20. This allows cracks and warpage to be avoided during curing.

For the production of a two-layer converter element the following materials may be selected. As a liquid polysiloxane resin a methoxymethyl polysiloxane is made or purchased. The methoxy content should be in the order of 10 to 50 wt %, for example, 32 wt %. The molecular weight should be such that the viscosity is in the range of 1 to 150 mPas, preferably in the range of 2 to 40 mPas.

Fumed silica with a specific surface area of 100 to 300 m2/g may be added. Further, as a hardener titanium n-butoxide is used.

With this method and the associated materials, essentially any color point can be achieved with the proper phosphor or phosphor blend.

First, the cured polysiloxane powder 25 to be used as a filler is prepared. Therefore, a desired amount of the liquid partially cured polysiloxane resin is measured into a container. In an optional step 5 wt % to 40 wt %, for example, 25 wt %, fumed silica is added to the liquid polysiloxane resin and blended to thoroughly incorporate the fumed silica. In either case, titanium n-butoxide is added so that the concentration is 0.5 wt % to 3.0 wt %, for example, 1 wt %, of the liquid polysiloxane resin. The polysiloxane resin is allowed to cure at ambient conditions for at least 12 to 24 hours. After the ambient cure, the solid material is heated to a temperature of 150 to 275° C. for 2 to 8 hours, and crushed into powdered form. The resulting particle size of the cured polysiloxane powder 25 should be in the range of 5 μm to 100 μm.

Next, a polysiloxane slurry containing a liquid polysiloxane resin and 5 wt % to 40 wt %, for example, 25 wt %, fumed silica is prepared.

Next, a first mixture containing the phosphor or phosphor blend 30 is prepared. Therefor, 29.4 wt % of the polysiloxane slurry, 56.5 wt % of a green phosphor and 14.1 wt % of a red phosphor are combined, for example.

For preparing the second mixture, cured polysiloxane powder 25 and liquid polysiloxane resin, along with optionally fumed silica are combined. For example, the following components are combined: 64.8 wt % of the polysiloxane slurry and 35.2 wt % of the cured polysiloxane powder 25.

Further, the hardener, e.g., titanium n-butoxide is added to the first mixture and to the second mixture and a first layer containing the first mixture and a second layer containing the second mixture are cast. The concentration of the hardener is about 0.5 wt % to 3.0 wt % of the amount of polysiloxane resin in each mixture.

Further, the combined tape, including the first layer containing the first mixture and the second layer containing the second mixture, is cured, and singulated converter elements 10 are provided. For this, the multilayer material is allowed to cure under ambient conditions, and the tape is singulated into individual converter elements by punching, slicing, dicing, or some other suitable method.

As with any wavelength conversion material, the converter elements 10 are ultimately incorporated into a lighting product. Usually, this means attaching the individual converter element 10 directly to a light emitting device surface, like a surface of a LED chip, using an appropriate adhesive, typically a silicone.

Any phosphor material that is applicable in LEDs is compatible with this method, so that almost any colorpoint is possible with this technology. Efficient and stable converter elements 10 can be made using a single phosphor 30 or a blend of phosphors 30.

Beyond fumed silica and phosphor 30, many other additives can be included in the first mixture and/or the second mixture in the slurry stage to change the properties of the final converter element 10. For example, nano-sized $ZrO_2$ can be added to increase the refractive index. Nanoparticles with high thermal conductivity could be added such as alumina, aluminum nitride, or hexagonal boron nitride to help keep the converter element operating at a low temperature.

The converter element 10 could be made of one or two layers as discussed above, but they could be made from an arbitrary number of layers. The cured polysiloxane powder 25 allows for thick films and films of different composition to be realized.

Figure 3:
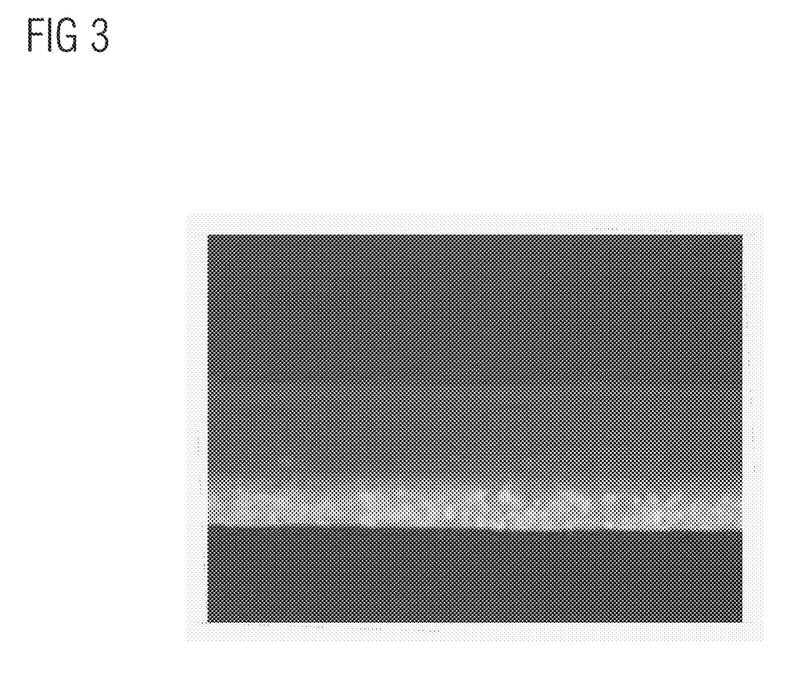
FIG. 3 shows a picture of the cross-section of a converter element according to an exemplary embodiment.

FIG. 3 shows a picture of the cross-section of a converter element 10 having two layers, the first layer containing the polysiloxane resin 20 and a phosphor 30 (bottom), the second layer containing the polysiloxane resin 20 and the cured polysiloxane powder 25 (top). The cured polysiloxane powder may comprise scale-like powder particles that are embedded in the polysiloxane resin 20. The total thickness of the converter element 10 is 200 μm, the thickness of the first layer is about 50 μm. When such a converter element 10 is applied on a surface of a LED chip, the luminescent material, i.e., the phosphor 30, is located within the first about 50 μm from the LED surface.

Figure 4:
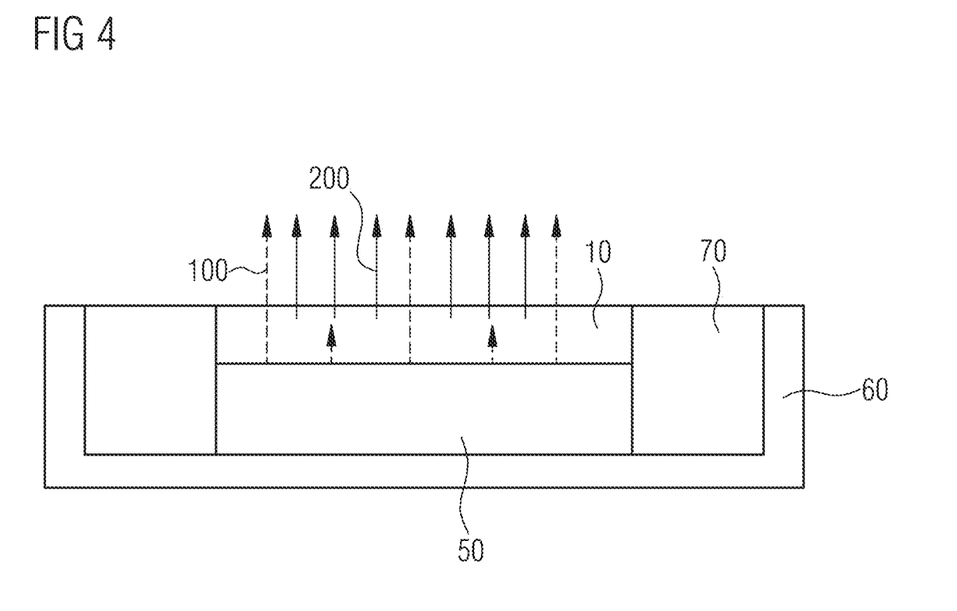
FIG. 4 shows a schematic cross section of a light emitting device.

FIG. 4 shows a schematic cross-section of a light emitting device, for example, an LED package. An active electromagnetic radiation emitting layer sequence so is arranged in a housing 60. A converter element 10 as described above is arranged on the layer sequence 50. Both are surrounded by a sealing material 70, for example, a reflective sealing material. The active layer sequence 50 emits light, i.e., electromagnetic radiation in a first wavelength range 100. The converter element 10 at least partially absorbs the electromagnetic radiation of the first wavelength range 100 and converts it to a second radiation of a second wavelength range 200 comprising wavelengths being larger than wavelengths of the first wavelength range 100. The entire emission of the light emitting device is composed of the first and second wavelength ranges 100, 200.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

What is claimed is:

1. A method for producing a converter element comprising:
   providing at least one phosphor and a liquid polysiloxane resin;
   preparing a cured polysiloxane powder from a first fraction of the liquid polysiloxane resin;
   preparing a mixture including the at least one phosphor, the cured polysiloxane powder and a second fraction of the liquid polysiloxane resin;
   casting and curing the mixture to a cured layer; and
   singulating the cured layer;
   wherein preparing the cured polysiloxane powder comprises curing the first fraction of the liquid polysiloxane resin at ambient conditions, heating and milling the cured polysiloxane resin.

2. The method according to claim 1, wherein the liquid polysiloxane resin comprises the formula:

wherein $T^1$ and $T^2$ represent terminal groups,
wherein $R^1$ to $R^4$ each represent side groups, and
wherein $0.8 \leq n \leq 1$, $0 \leq m < 0.2$ and $n+m=1$.

3. The method according to claim 1, wherein the liquid polysiloxane resin comprises a methoxy methyl polysiloxane.

4. The method according to claim 1, wherein fumed silica is added to the first fraction of the liquid polysiloxane resin before curing.

5. The method according to claim 1, wherein fumed silica is added to the second fraction of the liquid polysiloxane resin before preparing the mixture.

6. The method according to claim 1, wherein preparing the mixture comprises mixing the cured polysiloxane powder, the at least one phosphor and the second fraction of the liquid polysiloxane resin.

7. The method according to claim 6, wherein a hardener is added to the mixture.

8. The method according to claim 1, wherein preparing the mixture comprises:
   preparing a first mixture by mixing the at least one phosphor and a portion of the second fraction of the liquid polysiloxane resin; and
   preparing a second mixture by mixing the cured polysiloxane powder and another portion of the second fraction of the liquid polysiloxane resin.

9. The method according to claim 8, further comprising adding a hardener to the first mixture and to the second mixture.

10. The method according to claim 8, wherein the first mixture is cast to a first layer and the second mixture is cast to a second layer, the second layer being arranged on the first layer, and wherein the first layer has a thickness equal to or less than a thickness of the second layer.

11. The method according to claim 8, wherein the first mixture and the second mixture are cured together.

12. A method for producing a converter element comprising:
   providing at least one phosphor and a liquid polysiloxane resin;
   preparing a cured polysiloxane powder from a first fraction of the liquid polysiloxane resin;
   preparing a mixture including the at least one phosphor, the cured polysiloxane powder and a second fraction of the liquid polysiloxane resin;
   casting and curing the mixture to a cured layer; and
   singulating the cured layer;
   wherein preparing the mixture comprises:
      preparing a first mixture by mixing the at least one phosphor and a portion of the second fraction of the liquid polysiloxane resin; and
      preparing a second mixture by mixing the cured polysiloxane powder and another portion of the second fraction of the liquid polysiloxane resin.

* * * * *